(12) United States Patent
Langhorst (10) Patent No.: US 11,875,974 B2
(45) Date of Patent: Jan. 16, 2024

(54) MULTI-CHANNEL PLASMA REACTION CELL

(71) Applicant: Preservation Tech LLC, Hull, IA (US)

(72) Inventor: Phillip Gerard Langhorst, St. Louis, MO (US)

(73) Assignee: Preservation Tech, LLC, Hull, IA (US)

( * ) Notice: Subject to any disclaimer, the term of this patent is extended or adjusted under 35 U.S.C. 154(b) by 208 days.

(21) Appl. No.: 17/335,575

(22) Filed: Jun. 1, 2021

(65) Prior Publication Data
US 2021/0375593 A1 Dec. 2, 2021

Related U.S. Application Data

(60) Provisional application No. 63/032,542, filed on May 30, 2020.

(51) Int. Cl.
*H01J 37/32* (2006.01)

(52) U.S. Cl.
CPC .... *H01J 37/32522* (2013.01); *H01J 37/3244* (2013.01); *H01J 2237/002* (2013.01); *H01J 2237/327* (2013.01)

(58) Field of Classification Search
CPC ............. H01J 37/3244; H01J 37/32357; H01J 37/32522; H01J 37/32669; H01J 37/32825; H01J 37/32844
See application file for complete search history.

(56) References Cited

U.S. PATENT DOCUMENTS

| | | |
|---|---|---|
| 3,973,133 A | 8/1976 | Emigh et al. |
| 4,035,657 A | 7/1977 | Carlson |
| 4,048,668 A | 9/1977 | Von Bargen et al. |
| 4,386,395 A | 5/1983 | Francis |
| 4,877,588 A | 10/1989 | Ditzler et al. |
| 4,882,129 A | 11/1989 | Andrews et al. |
| 5,094,822 A | 3/1992 | Dunder |
| 5,124,132 A | 6/1992 | Francis, Jr. et al. |
| 5,145,350 A | 9/1992 | Dawson et al. |
| 5,313,145 A | 5/1994 | Francis, Jr. et al. |
| 5,417,936 A | 5/1995 | Suzuki et al. |
| 5,427,693 A | 6/1995 | Mausgrover et al. |
| 5,518,698 A | 5/1996 | Karlson et al. |
| 5,525,310 A | 6/1996 | Decker et al. |
| 5,529,760 A | 6/1996 | Burris |

(Continued)

*Primary Examiner* — Tung X Le
(74) *Attorney, Agent, or Firm* — Dentons Davis Brown; Matthew Coryell (57) ABSTRACT

A plasma reaction cell includes a discharge chamber with a base plate, a side wall, and a cooling plate. A discharge stack mounted within the discharge chamber includes a first insulation plate, a first conductive spacer, a second insulation plate, and a second conductive spacer. An electrode electrically coupled to the first conductive spacer extends through the side wall of the discharge chamber. A first gas channel formed between the first conductive spacer and the first insulation plate has a first end in fluid communication with a first gas port and a second end in fluid communication with a second gas port. A second gas channel formed between the first conductive spacer and the second insulation plate has a first end in fluid communication with the first gas port and a second end in fluid communication with the second gas port.

20 Claims, 8 Drawing Sheets

(56) References Cited

U.S. PATENT DOCUMENTS

| | | | |
|---|---|---|---|
| 5,547,644 A | 8/1996 | Taylor et al. | |
| 5,573,733 A | 11/1996 | Salama | |
| 5,578,280 A | 11/1996 | Kazi et al. | |
| 5,607,562 A | 3/1997 | Shimamune et al. | |
| 5,637,279 A | 6/1997 | Besen et al. | |
| 5,641,461 A | 6/1997 | Ferone | |
| 5,661,308 A * | 8/1997 | Benveniste | H01J 27/16 315/111.81 |
| 5,766,560 A | 6/1998 | Cole | |
| 5,855,856 A | 1/1999 | Karlson | |
| 5,911,957 A | 6/1999 | Khatchatrian et al. | |
| 6,046,533 A | 4/2000 | Nakatsuka | |
| 6,165,423 A | 12/2000 | Crosbie | |
| 6,264,897 B1 | 7/2001 | Ishioka et al. | |
| 6,270,733 B1 | 8/2001 | Rodden | |
| 6,468,400 B2 | 10/2002 | Smith | |
| 6,491,879 B2 | 12/2002 | Conrad | |
| 6,699,441 B2 | 3/2004 | Martin | |
| 6,932,946 B2 | 8/2005 | Shinjo et al. | |
| 6,994,832 B2 | 2/2006 | Borgstrom | |
| 7,198,765 B2 | 4/2007 | Tabata et al. | |
| 7,382,087 B2 | 6/2008 | Tabata et al. | |
| 7,744,825 B2 | 6/2010 | Tabata et al. | |
| 7,746,001 B2 | 6/2010 | Francis, Jr. | |
| 7,767,006 B2 | 8/2010 | Tokuno et al. | |
| 7,943,098 B2 | 5/2011 | Phillips et al. | |
| 7,952,048 B2 * | 5/2011 | Choi | H01J 37/32009 219/121.36 |
| 8,568,664 B2 | 10/2013 | Francis, Jr. et al. | |
| 8,771,538 B2 * | 7/2014 | Lubomirsky | H01J 37/32357 315/111.41 |
| 8,815,064 B2 | 8/2014 | Kato et al. | |
| 9,039,985 B2 | 5/2015 | Owens et al. | |
| 9,078,941 B2 | 7/2015 | Dunkley et al. | |
| 9,186,647 B2 | 11/2015 | Okihara et al. | |
| 9,469,537 B2 | 10/2016 | Wolf | |
| 9,580,318 B2 | 2/2017 | Owens et al. | |
| 9,623,140 B2 | 4/2017 | Jurak et al. | |
| 9,712,951 B2 | 7/2017 | Kirshenberg et al. | |
| 9,978,770 B2 | 5/2018 | Kobayashi et al. | |
| 10,029,025 B2 | 7/2018 | Nettesheim | |
| 10,111,978 B2 | 10/2018 | Waddell et al. | |
| 10,276,344 B2 | 4/2019 | Sung et al. | |
| 10,297,984 B2 | 5/2019 | Sunshine | |
| 10,317,096 B2 | 6/2019 | Waddell | |
| 10,319,569 B2 | 6/2019 | Waddell | |
| 10,322,205 B2 | 6/2019 | Waddell | |
| 10,383,970 B2 | 8/2019 | Waddell | |
| 10,384,938 B2 | 8/2019 | Costello | |
| 10,395,892 B2 | 8/2019 | Foret | |
| 10,439,370 B2 | 10/2019 | Sunshine | |
| 11,646,183 B2 * | 5/2023 | Prouty | H01J 37/32724 156/345.34 |
| 2002/0101167 A1 * | 8/2002 | Shan | H01J 37/32082 315/111.11 |
| 2006/0049738 A1 * | 3/2006 | Tabata | C01B 13/11 313/362.1 |
| 2015/0255256 A1 * | 9/2015 | Cox | H01J 37/32357 313/32 |
| 2018/0337024 A1 * | 11/2018 | Tan | H01J 37/32522 |
| 2019/0027345 A1 * | 1/2019 | Ishikawa | H01J 37/32981 |

* cited by examiner

MULTI-CHANNEL PLASMA REACTION CELL

CROSS-REFERENCE TO RELATED APPLICATION(S)

This application claims the benefit under 35 U.S.C. § 119(e) to U.S. Provisional Application 63/032,542, filed May 30, 2020 and entitled "Multi-Channel Plasma Reaction Cell," which is hereby incorporated herein by reference in its entirety.

TECHNICAL FIELD

The disclosed technology relates generally to plasma reaction cells configured to produce gases through plasma discharge.

BACKGROUND

Electric chemical reactions are often used to manufacture particular chemical substances, including by high voltage discharge. One example is the production of a desired molecular substance by plasma reaction of an input gas. The plasma is effective in breaking chemical bonds, thereby facilitating the creation of other chemical bonds. Plasma is used in the production of many desirable chemicals such as producing ammonia from nitrogen and hydrogen, converting carbon dioxide into useful hydrocarbons, and generating ozone from oxygen.

An example of an electric discharge reactor has a reaction cell that receives an input chemical fluid such as a gas or liquid. In some cases the reaction cell may also be pressurized depending upon the particular reaction. The reaction cell typically includes two electrodes of opposing polarity, which in some cases are configured as electrode plates. In some cases a dielectric material is also positioned between the electrodes. For example, in some cases the dielectric material may be deposited on the surface of one of the electrodes. During operation, the input fluid is directed through a passage between the two electrodes and a high voltage is applied. When the applied voltage reaches a sufficient threshold, the electric field between the electrodes breaks down, causing electricity to discharge through the input fluid. The resulting electric current has the ability to break some of the chemical bonds of the input fluid, thereby forming different types of desired molecules.

While electric discharge reactors are useful for manufacturing various gases and other chemical products, the reactors can also have undesirable aspects. As an example, the electric discharge process is often inefficient, leading to the wasteful generation of much heat. In some cases, for example, converting oxygen into ozone using plasma can generate an output that is less than 10% ozone. As the flow rate is increased, even less concentration is achieved. In some cases the loss of concentration at high flow can be offset by having several production cells in parallel in order to lower the flow rate in each cell. Using multiple cells, though, has the disadvantage of additional cost and weight.

There is thus a need in the art for improved electric chemical discharge reactors, including improved plasma discharge reactors, systems and methods.

SUMMARY

This disclosure generally describes embodiments that relate to generating gas through plasma discharge. Examples of the disclosed technology include plasma reaction cells and related devices, systems, and methods.

One general aspect of the disclosed technology includes a plasma reaction cell. The plasma reaction cell includes a first gas port, a second gas port, an electrode, and a discharge chamber. The discharge chamber includes a base plate, a side wall attached to the base plate, and a cooling plate attached to the side wall opposite the base plate. A discharge stack is mounted within the discharge chamber. The discharge stack includes a first insulation plate positioned adjacent to the cooling plate and a first conductive spacer positioned proximate to the first insulation plate. A second insulation plate is positioned proximate to the first conductive spacer opposite from the first insulation plate and a second conductive spacer is positioned adjacent to the second insulation plate opposite from the first conductive spacer. The discharge stack also includes a first gas channel formed between the first conductive spacer and the first insulation plate and a second gas channel formed between the first conductive spacer and the second insulation plate. The first gas channel includes a first end in fluid communication with the first gas port and a second end in fluid communication with the second gas port and the second gas channel includes a first end in fluid communication with the first gas port and a second end in fluid communication with the second gas port. The electrode is electrically coupled to the first conductive spacer and extends through the side wall of the discharge chamber.

Implementations according to this aspect of the disclosure may include one or more of the following features. In some cases the cooling plate includes a first gas passage in fluid communication with the first gas port and a second gas passage in fluid communication with the second gas port. In various implementations the first insulation plate include a plate opening in fluid communication with the second gas passage. In various cases the first conductive spacer includes a spacer opening in fluid communication between the second ends of the first and second gas channels and the plate opening. The second gas passage includes a passage opening that in various cases is in fluid communication with the plate opening. According to various implementations, the passage opening has a diameter of about 0.375 inches, the plate opening has a diameter of about 0.200 inches, and the spacer opening has a diameter of about 0.875 inches.

Various implementations may in some cases further include one or more of the following features. In some cases, the discharge stack further includes a first channel spacer positioned between the first insulation plate and the first conductive spacer and a second channel spacer positioned between the second insulation plate and the first conductive spacer. In some such cases the first channel spacer forms the first gas channel and the second channel spacer forms the second gas channel. In some cases the first and second channel spacers include a conductive material. In various implementations the first and second channel spacers have a thickness of about 0.001 inches to about 0.015 inches. In various implementations the first conductive spacer includes first and second surfaces and the first gas channel is formed in the first surface between the first conductive spacer and the first insulation plate and the second gas channel is formed in the second surface between the first conductive spacer and the second insulation plate. According to some cases, the cooling plate includes a heatsink plate and in some cases the cooling plate includes a fluid cooling passage in fluid communication with first and second fluid ports. In some implementations the side wall is cylindrical.

Another general aspect of the disclosed technology includes a plasma reaction cell. The plasma reaction cell includes a discharge chamber that includes a base plate, a side wall attached to the base plate, and a heatsink plate attached to the side wall opposite the base plate. The heatsink plate includes first and second gas passages extending between an interior and an exterior of the discharge chamber. In various cases a discharge stack is mounted within the discharge chamber. The discharge stack in some cases includes a first insulation plate positioned adjacent to the heatsink plate. The first insulation plate includes a plate opening in fluid communication with the second gas passage. The discharge stack also includes a first conductive spacer positioned adjacent to the first insulation plate. The first conductive spacer includes first and second opposing surfaces, a spacer opening in communication with the plate opening, a first gas channel formed in the first surface, and a second gas channel formed in the second surface. The first gas channel includes a first end in fluid communication with the first gas passage and a second end in fluid communication with the spacer opening. The second gas channel includes a first end in fluid communication with the first gas passage and a second end in fluid communication with the spacer opening. The cell also includes a second insulation plate positioned adjacent to the first conductive spacer, opposite from the first insulation plate and a second conductive spacer positioned adjacent to the second insulation plate opposite from the first conductive spacer. The cell also includes an electrode electrically coupled to the first conductive spacer and extending through the side wall of the discharge chamber.

Another general aspect of the disclosure includes a plasma reaction cell. The plasma reaction cell includes a first gas port, a second gas port, a first discharge stack mounted within a first discharge chamber, a first electrode, a second discharge stack mounted within a second discharge chamber and a second electrode. The first discharge chamber includes a first support plate, a first side wall attached to the first support plate, and a cooling plate attached to the first side wall opposite the first support plate. The first electrode extends through the first side wall. The cooling plate includes a first gas passage in fluid communication with the first gas port and a second gas passage in fluid communication with the second gas port. The second discharge chamber includes the cooling plate, a second side wall attached to the cooling plate opposite the first side wall, and a second support plate attached to the second side wall opposite the cooling plate. The second electrode extends through the second side wall.

According to this aspect, each of the first and second discharge stacks includes a first insulation plate positioned adjacent to the cooling plate and a first conductive spacer positioned proximate the first insulation plate. The first conductive spacer of each discharge stack is electrically coupled to one of the first and the second electrodes. Each discharge stack also includes a second insulation plate positioned proximate the first conductive spacer, opposite from the first insulation plate, and a second conductive spacer positioned adjacent to the second insulation plate opposite from the first conductive spacer. Each discharge stack further includes a first gas channel formed between the first conductive spacer and the first insulation plate and a second gas channel formed between the first conductive spacer and the second insulation plate. The first and second gas channels each include a first end in fluid communication with the first gas passage and a second end in fluid communication with the second gas passage.

Implementations according to this aspect may include one or more of the following features. In some cases the first conductive spacer includes a spacer opening in fluid communication between the second ends of the first and second gas channels and the second gas passage. In some cases the cooling plate includes a fluid cooling passage in fluid communication with first and second fluid ports. In various implementations the first conductive spacer includes first and second surfaces. The first gas channel is in some cases formed in the first surface between the first conductive spacer and the first insulation plate. The second gas channel is in some cases formed in the second surface between the first conductive spacer and the second insulation plate.

In various implementations the first conductive spacer includes opposing first and second surfaces and the first gas channel is formed in a surface of the first insulation plate facing the first surface of the conductive spacer and the second gas channel is formed in a surface of the second insulation plate facing the second surface of the first conductive spacer.

In various implementations each of the first and second discharge stacks further includes a first channel spacer and a second channel spacer that respectively form the first gas channel and the second gas channel. In some cases the first channel spacer is positioned between the first insulation plate and the first conductive spacer. In some cases the second channel spacer is positioned between the second insulation plate and the first conductive spacer.

According to this aspect, in some cases the first and second channel spacers include a conductive material. The first and second channel spacers may have a thickness of about 0.001 inches to about 0.015 inches. In some cases the side wall is cylindrical.

DETAILED DESCRIPTION

Aspects of the disclosed technology provide improvements to plasma discharge reaction cells including, but not limited to, lower flow rates and higher product concentration. As will be discussed, in various implementations a plasma reaction cell includes multiple gas channels that increase the amount of plasma reaction and gas production within a single cell. In various implementations a single reaction cell can include multiple sub-cells, each sub-cell providing gas channels for plasma reaction.

According to various implementations, a plasma reaction cell has one or more conductive spacers or plates (e.g., formed of metal or another conductive material) positioned within a reaction cell. The spacers are separated from the walls of the cell by insulation plates generally made from a dielectric material. In some cases the dielectric material is a ceramic material. The walls of the cell are generally at low or ground potential. The conductive spacer(s) are operated at a high electric potential, in some cases a few thousand volts. According to various implementations, channels for gas flow are formed between the conductive spacer(s) and the insulation plates. In various cases a gas, such as air or concentrated oxygen, is forced to flow in the channels between the conductive spacer(s) and the insulation plates. When sufficient voltage is applied between the conductive spacer(s) and the walls of the chamber, the gas in the channels will ionize and thus lead to input gas breakdown and generation of a desired product gas.

According to some implementations, insulation plates are formed from a dielectric material that in some cases is a ceramic material. In such cases the dielectric material insulates conductive spacers and also forms a capacitor between the spacers, in series with the plasma chamber, which has a specific impedance that enables the creation of a homogenous field of plasma. With the dielectric insulation plate in place, any current flowing in one spot creates a voltage drop across the insulation plate resulting in lower voltage across the plasma chamber at that spot. Ionization can now occur preferentially in a different location since every other location in the plasma chamber has a higher voltage across it than the spot in question. Accordingly, the use of a dielectric insulation plate can result in a more uniform field of ions throughout the plasma chamber.

In various implementations, a plasma reaction cell includes a cylindrical cell that is short compared to its diameter. In some cases two conductive (e.g., metal) spacers are positioned inside the cell. In some cases the spacers have a similar diameter and are forced by a set of compression springs against a cooling plate. An insulation plate is deposed between the metal spacers. A second insulation plate is deposed between the thick spacer and the cooling plate. The compression springs force the metal plates against the insulation plates and force the insulation plates against the cooling plate. One of spacers has a shallow serpentine channel machined into its surfaces which are facing the insulation plates. Each serpentine channel starts at the periphery of the plates and ends in the center. These serpentine channels are the plasma chambers. The serpentine shape of each channel provides a long length for the gas to travel allowing greater time for the gas to be exposed to the plasma.

According to various implementations, the internal conductive spacer, and one (or both) insulation plates have a hole or opening in their center which provides a passage for gas to reach both channels. Gas, air, or concentrated oxygen enters each channel at the periphery, passes though both channels where is it exposed to plasma, is collected in the center, and passes out of the cell via a radial hole in the cooling plate. The flow of gas can also be in the reverse direction, exiting at the periphery.

In some cases one set of internal metal spacers with two channels forming two plasma chambers is called a "sub-cell". One sub-cell can be used on its own and can be water-cooled or air-cooled.

The disclosed technology also includes implementations in which two sub-cells are joined to a common center metal plate creating four parallel channels each carrying one-fourth of the total flow and not requiring external electrical or plumbing to couple the addition channels. The combination of four channels and serpentine length allows the gas to spend more time in the cell for a given cell volume than past single or double channel cells.

In some implementations, external electrical and gas connections allow a number of sub-cells to stacked, increasing the number of parallel channels to 6, 8, 10, 12, etc., greatly increasing the capacity of a single assembly.

Objects of the present technology that may optionally be addressed in various implementations of the technology include: providing a plasma reaction cell capable of allowing the input gas to spend greater time exposed to plasma, providing a compact plasma reaction cell with production capacity similar to cells of larger physical size, and/or providing a compact ozone generating cell with ozone production capacity similar to cells of larger physical size. These and other objects and aspects of the disclosed technology will now be discussed with respect to the drawings.

Figure 1:
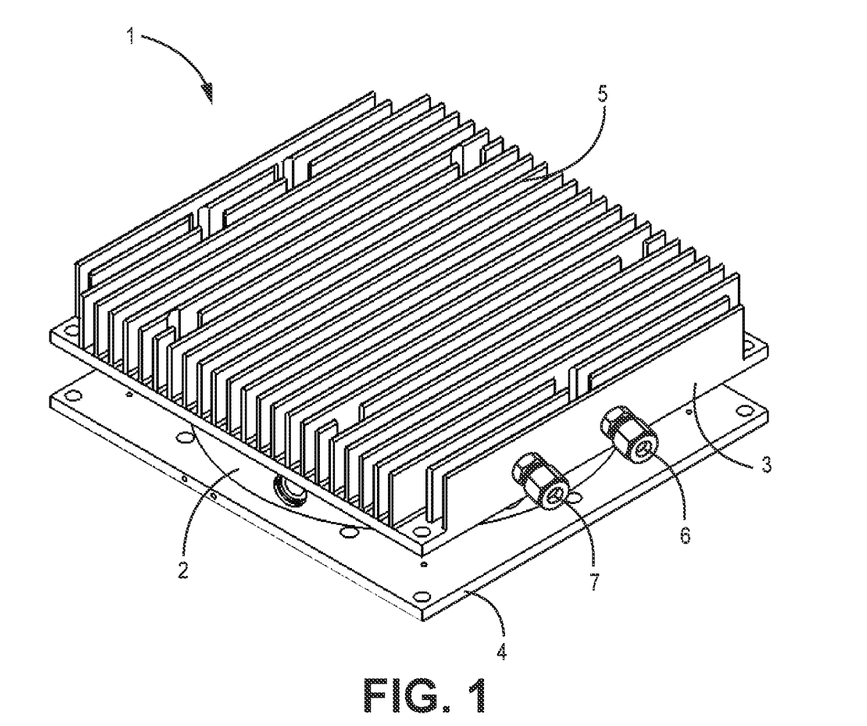
FIG. 1 is a perspective view of a plasma reaction cell according to an embodiment.

FIG. 1 is a perspective view of an air-cooled plasma reaction cell according to various implementations. The cell 1 includes a cylinder 2, a cooling plate 3 (sometimes also referred to as a heatsink plate), and a support or base plate 4, which is also referred to as an outer plate 4. Fins 5 improve heat rejection. A device with only one cylinder 2, is also referred to herein as a sub-cell. Input fitting 7 and output fitting 6 exist on the side of the heatsink plate 3.

Figure 2:
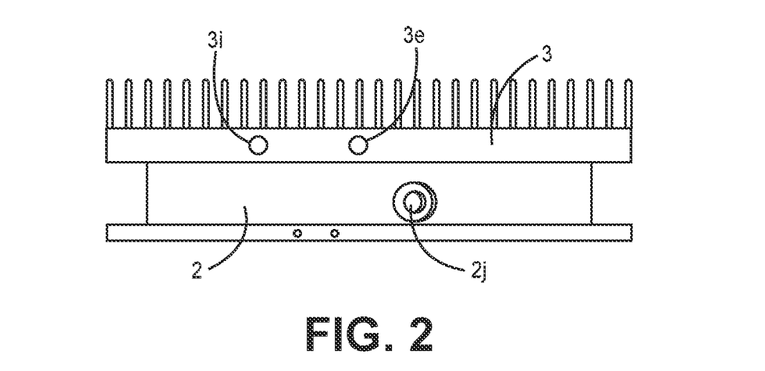
FIG. 2 is a side view of the plasma reaction cell of FIG. 1.

In FIG. 2 there is shown a side view of the plasma reaction cell 1 of FIG. 1 with fittings removed. Heatsink plate 3 has gas inlet port 3$i$ and gas exit port 3$e$. Cylinder wall 2 has a hole 2$j$ to accept an electrode.

Figure 3:
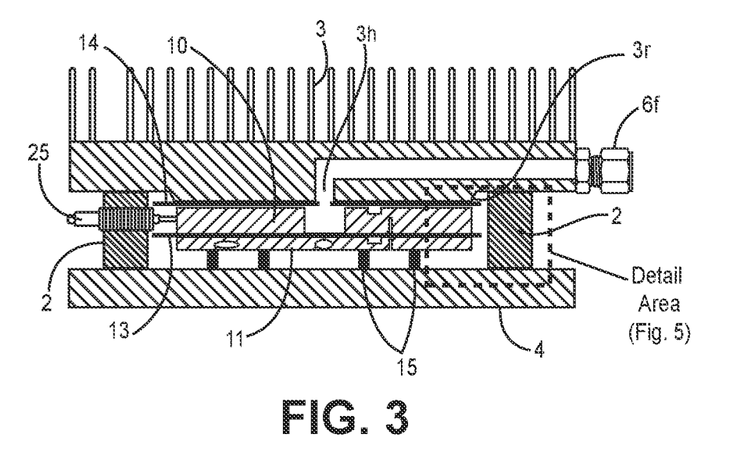
FIG. 3 is a sectional view of the plasma reaction cell of FIG. 1.
Figure 5:
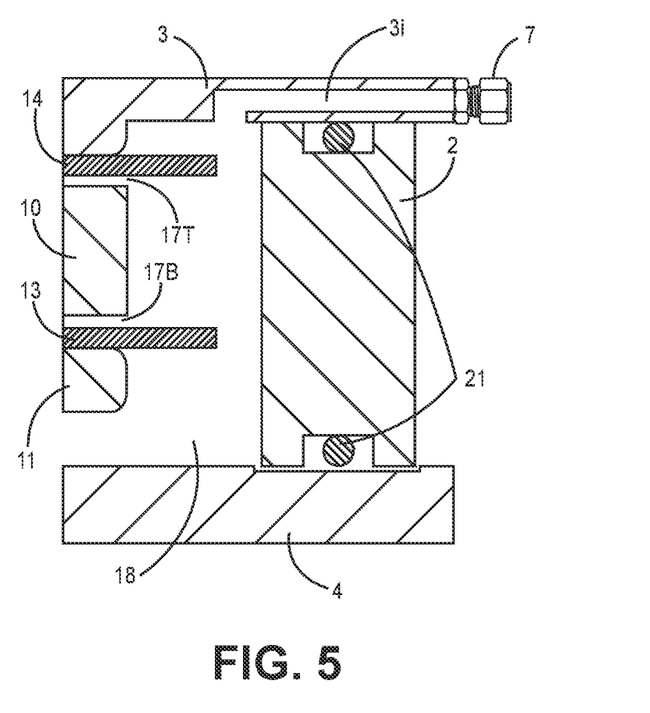
FIG. 5 is a an enlarged sectional view of a portion of the plasma reaction cell of FIG. 1.

In FIG. 3 there is shown a section view of cell 1. A first conductive spacer 10 and a second conductive spacer 11 are inside the cell, surrounded by the wall of cylinder 2. For convenience, the first and second conductive spacers 10, 11 are sometimes referred to herein as the thick metal spacer 10 and thin metal spacer 11, although in various implementations the relative thickness and size of the spacers 10, 11 can be different. The heatsink plate 3 has a raised portion 3$r$. One insulation plate 13, is deposed between the conductive spacers 10 and 11. A second insulation plate is deposed between the thick spacer 10, and the raised portion 3$r$, of the heatsink plate 3. In some cases one or both insulation plates are formed from a dielectric material such as a ceramic material.

Springs 15, force thin spacer 11, away from outer plate 4, causing both insulation plates 13 and 14 to make contact with the faces of the thick spacer 10. An electrode 25, penetrates the wall of cylinder 2, and allows an external high voltage power supply to be connected to the thick spacer 10. Springs 15, also make electrical contact between thin spacer 11, and outer plate 4. The outer plate 4 is electrically connected to the heatsink plate 3, via contact with the cylinder 2. In this arrangement, the thick spacer 10 is electrically isolated from the cylinder 2, and from the outer plate 4, and from the heatsink plate 3. A portion of FIG. 3 shown in the dotted rectangular area is the subject of FIG. 5.

Figure 4:
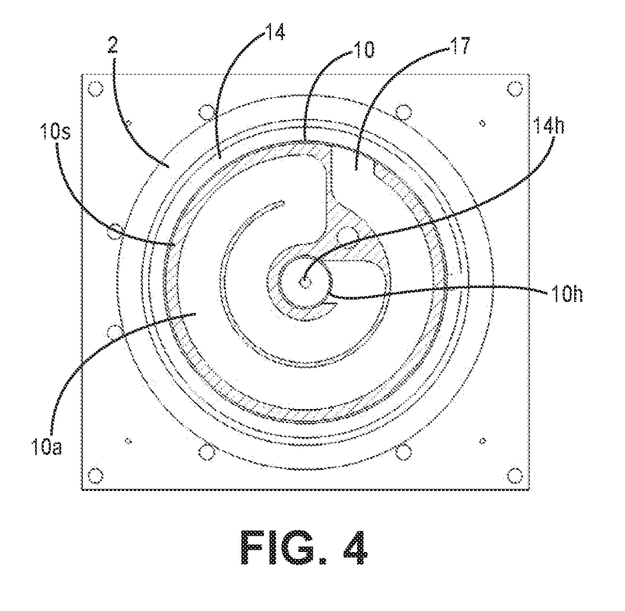
FIG. 4 is a partial sectional view of the plasma reaction cell of FIG. 1.

FIG. 4 is a plan view of the plasma reaction cell 1 looking up with the outer plate removed and the lower insulation plate removed showing the cylindrical cell wall 2, lower insulation plate 14, and the thick spacer 10. Serpentine 10a channel is a shallow cut into the face of the thick spacer 10. The entrance to the serpentine channel is shown at point 17. The serpentine channel 10a is cut into the thick spacer 10, and is at a lower level relative to the shaded portion 10s of the thick spacer 10. The shaded portion 10s, contacts the insulation plate 13 but the serpentine channel 10a does not. Insulation plate 14 has a small hole in its center at 14h. The thick spacer 10, has a larger hole in its center at 10h. The serpentine channel 10a ends at the center 10h of the thick spacer 10.

According to various implementations, the hole 14h in the insulation plate 14 is of smaller diameter than the hole 10h in the thick spacer 10, and smaller than the hole 3h in the heatsink plate 3. This combination can create a longer creepage distance to help avoid electric break down of the input gas around the periphery of the insulation plates. In some cases, the insulation plate between the first conductive spacer and the cooling plate (e.g., heatsink plate) has this hole to provide fluid communication between an outlet gas passage in the cooling plate and the hole 10h in the conductive spacer 10 as shown in FIG. 4. In various implementations the insulation plate between the first and second conductive spacers may not have a hole or opening but instead provide a smooth surface adjacent to the second gas channel in fluid communication with the hole 10h in the thick spacer 10.

Although not shown in FIG. 4, in various implementations the thick spacer 10 has a top surface and a bottom surface. There are two channels 10a, one formed on each of the surfaces. The insulation plates 13, and 14 and the spacer 10 thus form two narrow chambers which will become filled with plasma when the thick spacer 10 is energized with high voltage.

FIG. 5 is a detailed section view of FIG. 3 taken along a line running through an input fitting 7 (while FIG. 3 is a section generally taken along a line intersecting the output fitting 6). Gas enters the cell via fitting 7 which passes through the heatsink plate 3, via input port 3i. The gas fills the entire internal volume 18, of the cell. A gasket or O-ring 21, forms a seal between the cylinder 2 and plates 3, and 4, effectively keeping gas from the cell's interior 18 from escaping. Gas enters the narrow serpentine channels at points 17T, and 17B.

The gas entering at point 17T will travel the length of the serpentine channel 10a, through the hole 14h, in the center of the insulation plate 14, and through the hole 3h in the center of the heatsink plate 3, exiting via port 3e, to the output fitting 6. Gas entering at point 17B will travel farther, since it will travel the length of the serpentine channel, through the hole 10h, in the center of the thick spacer 10, then through a hole 14h in the center of the insulation plate 14, and then through the hole 3h in the center of the heatsink plate 3, exiting via port 3e, to the output fitting 6.

Figure 6:
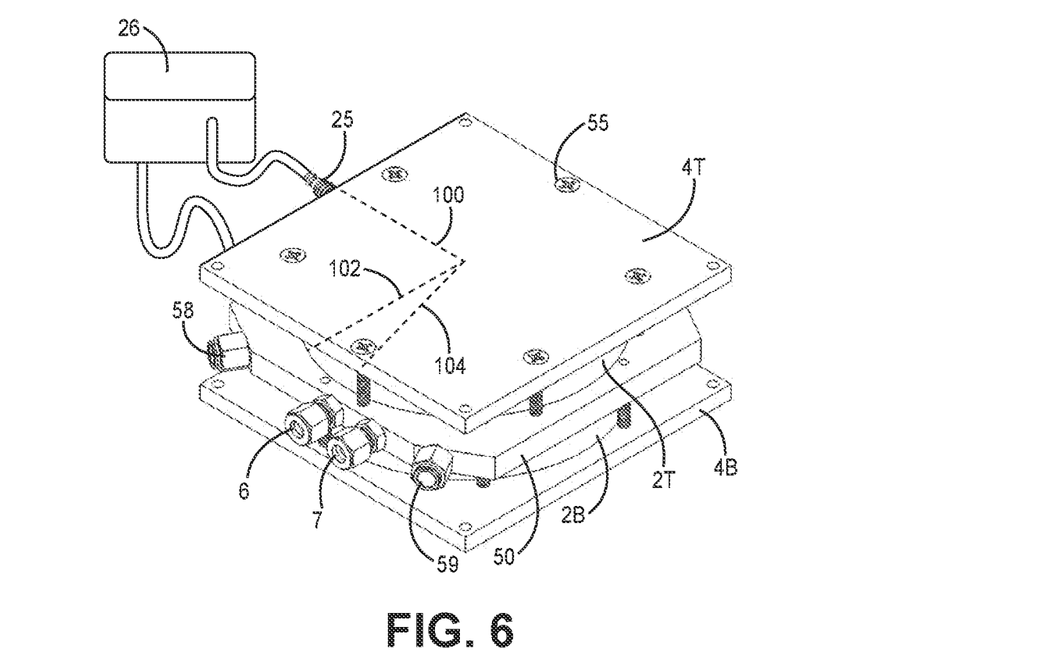
FIG. 6 is a perspective view of a plasma reaction cell connected with a power supply according to an embodiment.

FIG. 6 shows a perspective view of a water-cooled plasma reaction cell according to various implementations. In this example the cell has four gas channels. In this embodiment, there are two sub-cells, one on either side of a center plate 50. One sub-cell is contained by cylinder 2T, and outer plate 4T. The other sub-cell is contained by cylinder 2B and outer plate 4B. Screws 55, clamp the plates and the cylinders to the center plate 50.

The center plate 50 has internal passages for input gas, product gas, and cooling fluid (e.g., water). Input gas enters at a port 7. Product gas exits at a port 6. Cooling fluid enters at a port 58, and exits at a port 59, or vise-versa. An electrode 25, connects to an external power supply 26, and carries electrical energy to the thick spacer within each sub-cell.

Figure 7:
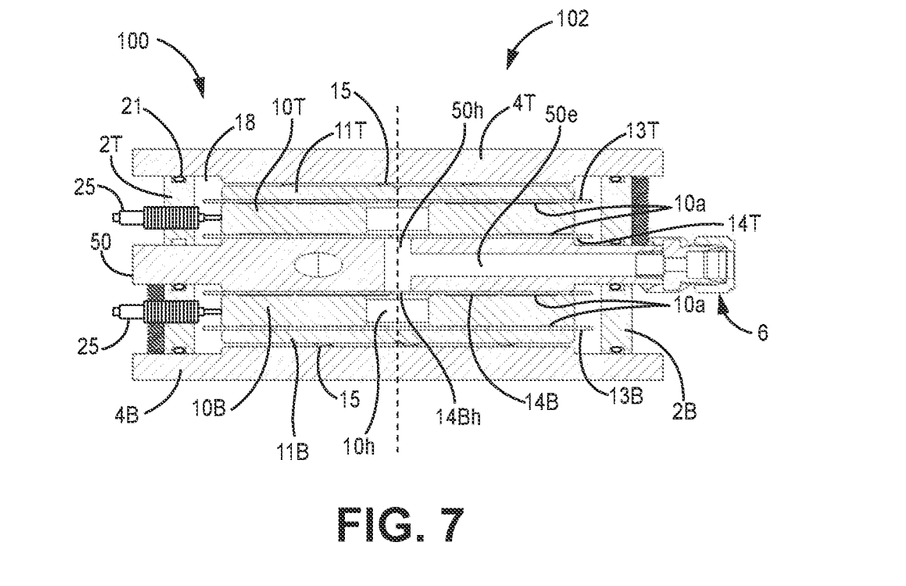
FIG. 7 is a composite sectional view of the plasma reaction cell of FIG. 6.

FIG. 7 is a constructed, composite sectional view of the plasma reaction cell of FIG. 6. The left half 100 of FIG. 7 is a partial section of FIG. 6 taken along line 100. The right half 102 of FIG. 7 is a partial section of FIG. 6 taken along line 102. The walls of the cylinders 2T, and 2B contain grooves for O-rings 21. These form a seal, effectively creating a chamber 18 inside the cylinder walls 2T, and 2B. Between the center plate 50 and the outer plates 4T, and 4B are disposed thick spacers 10T, 10B and thin spacers 11T, 11B. As discussed above, in some cases the spacers may be relatively thick or thin, the same, or of various thicknesses and implementations are not limited to the depicted example. Four insulation plates 13T, 14T, 13B, and 14B are disposed on either side of the thick spacers 10T, 10B. The thick spacers 10T, 10B, have a shallow channel 10a, on both faces. The thin spacers 11T, and 11B are smooth and flat on both faces. Springs 15, force the thin spacers 11T, 11B against the thick spacers 10T, 10B. Electrodes 25 connect to an external power supply 26, and elevate the voltage potential of the thick spacers to the point of creating plasma in the channels on their faces. Gas under pressure in the cavity 18 flows though the four channels in the thick spacers 10T, 10B and into the hole 10h in the center of spacer.

Figure 8:
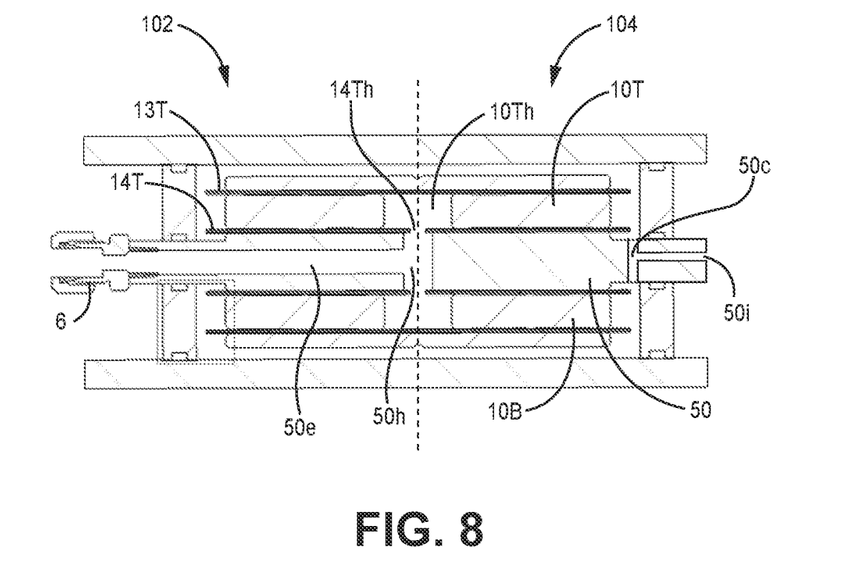
FIG. 8 is a composite sectional view of the plasma reaction cell of FIG. 6.

FIG. 8 is a larger composite sectional view of FIG. 6 of the depicted plasma reaction cell. The left half 102 of FIG. 8 is a partial section of FIG. 6 taken along line 102. The right half 104 of FIG. 8 is a partial section of FIG. 6 taken along line 104. Input gas enters at port 50i, and flows into both sub-cells via cross channel 50c. Gas then travels into the four serpentine channels on the faces of the thick spacers 10T and 10B. When the thick spacers are elevated to a sufficiently high electrical potential relative to the cooling plate 50, plasma will form in the channels. Some fraction of the gas in the channels is converted to product gas by the activity of the plasma. The product gas mixture flows through a hole 10Th, in the thick spacer 10T, and then flows through hole 14Th in the insulation plate 14T, and then flows through the hole 50h in the center plate 50, and exits the cell via port 50e. A similar flow takes place through the other half of the cell with the mixture flowing through the hole in the thick spacer 10B exiting via the same port 50e.

According to various implementations, the hole 14Th in the insulation plate 14T has a diameter that is smaller than the hole 10Th in the thick spacer 10T and also smaller than the hole 50h in the center plate 50. As an example, in various implementations the hole 10Th in the conductive spacer 10T has a diameter of 0.875 inches, the hole 14Th in the insulation plate has a diameter of 0.200 inches, and the hole 50h in the center plate has a diameter of 0.375 inches. This combination can create a longer creepage distance and thus reduce the likelihood of an electric beak down of the gas around the insulation plates. In various implementations the sizes of the various through holes may change while retaining the relative sizing among the holes. In various implementations the relative sizing may be different. For example, in some cases the hole in the insulation plate remains the smallest while the hole in the center plate has a larger diameter than the hole in the conductive spacer.

Continuing with reference to FIG. 8, in various implementations, gas enters a plasma reaction cell through a single port and is split into multiple gas channels. In the depicted example, gas enters a single port 50i and is split among four gas channels. The gas then enters four plasma chambers for reaction. Gas produced in the multiple plasma chambers is collected in a central channel in this example and exits though a single exit port 50e.

Figure 9:
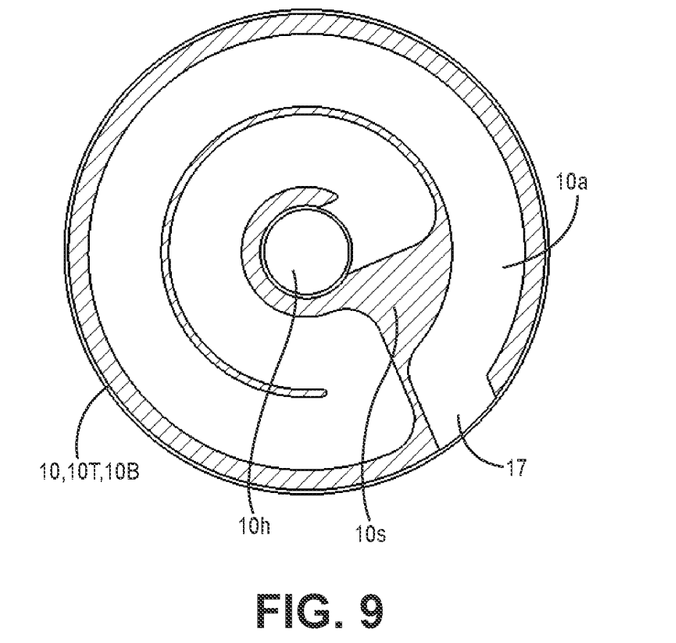
FIG. 9 is a plan view of a spacer according to an embodiment.

FIG. 9 shows a plan view of one example of a conductive spacer, which is alternatively referred to herein as thick spacer 10, thick spacer 10T, and thick spacer 10B, such as is shown in FIG. 7. The shaded areas 10s are raised above the channel area 10a. In some cases the height difference may be very slight. In some cases the difference may be from 0.001 inch to 0.015 inch. Gas enters the channel at location 17, and exits through the hole 10h at the center of the conductive spacer. Although not shown, in various implementations both sides of thick spacer 10 have a shallow serpentine channel like 10a. Each serpentine channel is enclosed by one of the insulation plates, thus forming the plasma chambers.

As will be discussed further herein, in various implementations of the disclosed technology, the plasma chambers are formed not by shallow channels cut into the conductive spacers but are instead are formed by a channel spacer of the desired thickness, in the shape of the shaded area labeled 10s in FIG. 9. The channel spacer is disposed between the insulation plates and alternate thick spacers, which in this case have smooth surfaces. The combination of smooth surfaces and the channel spacer thus creates the desired channel and corresponding plasma chamber between the insulation plates and the conductive spacers.

In various implementations, the plasma chambers are formed not by shallow channels cut into the conductive spacers but are instead formed by a shallow serpentine channel cut into an etched insulation plate. The etched insulation plate is then forced against a thick spacer having a smooth surface to form the desired serpentine plasma chamber between the etched insulation plate and the smooth thick spacer.

Figure 10:
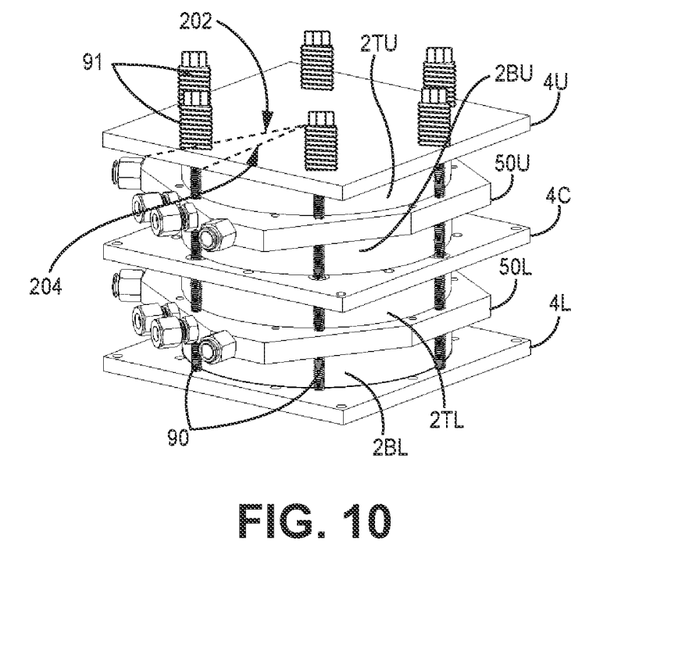
FIG. 10 is a perspective view of a plasma reaction cell according to an embodiment.

FIG. 10 shows a perspective view of a water-cooled plasma reaction cell according to various implementations. In this case the cell has eight gas channels. The additional channels are created by additional sub-cells stacked on top of one and other. In this example, there are five plates. There are two cooling plates 50U and 50L, two outer plates 4U, 4L, and a plate 4C which provides the function of the outer plates for the sub-cells above and below it. The plates are separated by cylinders 2TU, 2BU, 2TL, 2BL. Threaded rods 90, clamp the plates to the cylinders. The cooling plates 50U, 50L have internal passages for input gas, output gas, and cooling water as in the four-channel embodiment. Electrodes, not shown, connect to an external power supply to carry electrical energy into the sub-cells as in the four-channel embodiment.

It is apparent that any number of sub-cells can be stacked up to create a cell of greater capacity. In some cases when too many sub-cells are stacked, expansion of the components due to heating can create high tension forces in the threaded rods 90. In order to limit the amount of tension in the threaded rod, springs 91, can be used which will keep a relatively constant force holding the stack together, but still allow for thermal expansion.

When there are many sub-cells, it may also be necessary to have multiple power converters driving the cell.

Figure 11:
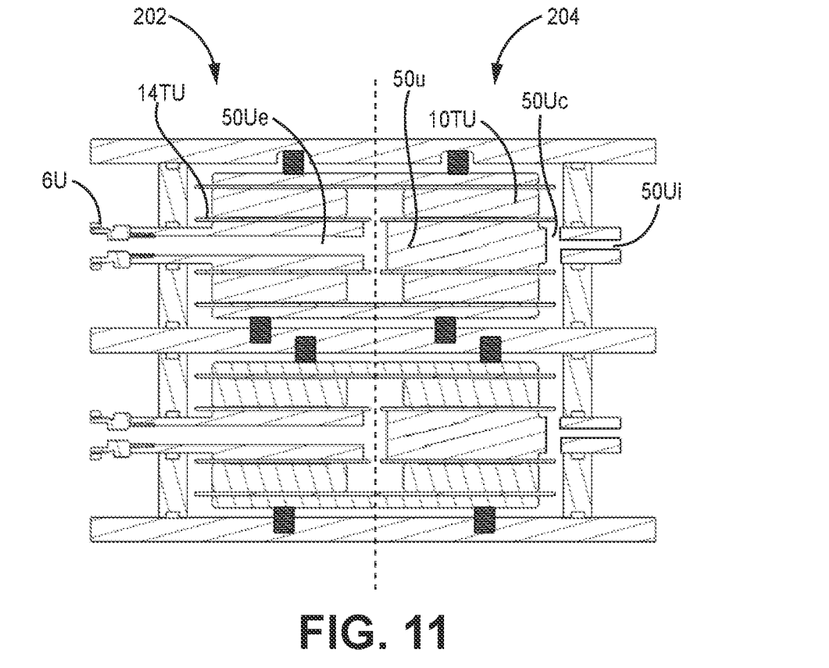
FIG. 11 is a composite sectional view of the plasma reaction cell of FIG. 10.

FIG. 11 shows a section view of the plasma reaction cell of FIG. 10. In this view it can be more clearly seen that gas entering input port 50Ui can flow though the cross channel 50Uc and enter two sub-cells simultaneously. It can also be seen that gas which has traversed the upper most serpentine channel and arrived at the center of the thick spacer 10TU, can pass through the hole in the thick spacer 10TU, and pass through the hole in the center of the insulation plate 14TU, and exit the cell via port 50Ue, to fitting 6U.

Figure 12:
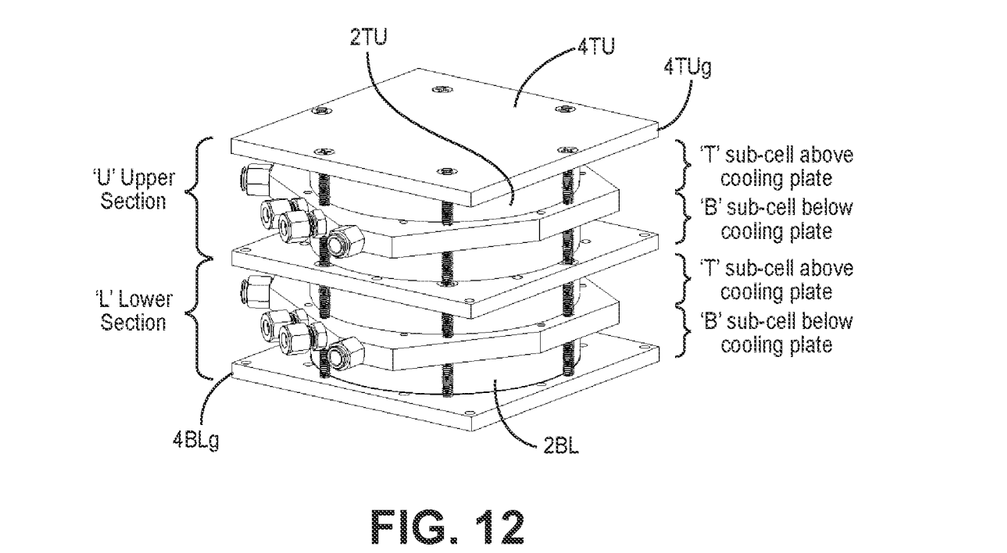
FIG. 12 is a perspective view of a plasma reaction cell according to an embodiment showing the naming convention of subscripts used throughout this disclosure.

FIG. 12 shows the naming convention used in this disclosure. Upper case letter suffixes are used to identify identical components use in more than one instance. Lower case letters are used to identify different features of one component. Components associated with the sub-cell above the cooling plate will have a "T" suffix. For example, in a four-channel system, the cylinder above the cooling plate is referred to as 2T. Components associated with the upper sub-cell in an eight-channel system will also have a "U" suffix. For example, in an eight-channel system, the upper most cylinder is referred to as 2TU. Components associated with the sub-cell below the cooling plate will have a "B" suffix. For example, in a four-channel system, the cylinder below the cooling plate is referred to as 2B. Components associated with the lower sub-cell in an eight-channel system will also have a "U" suffix. For example, in an eight channel system, the bottom most cylinder is referred to as 2BL. The upper most end plate is referred to as 4TU, the corner of this plate would be referred to as 4TUg. The same feature, on a different component, will carry the same lower case letter, for example, 4BLg.

Figure 13:
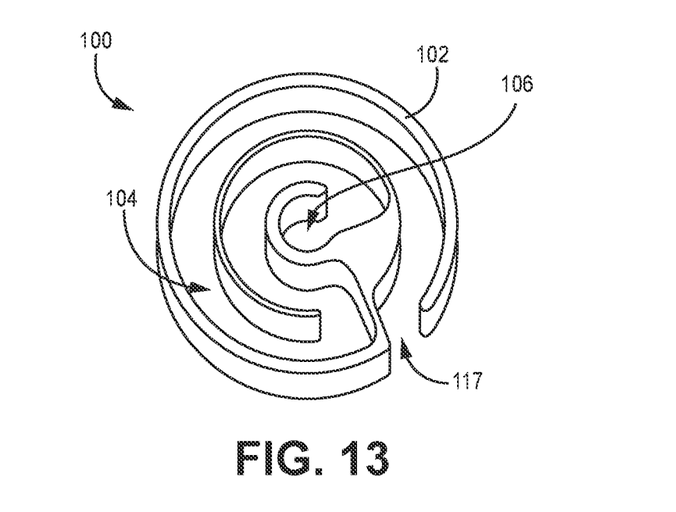
FIG. 13 is a perspective view of a channel spacer according to an embodiment.

As discussed above with respect to FIG. 9, in various implementations of the disclosed technology the plasma chambers are formed not by shallow channels cut into the conductive spacers but are instead formed by a channel spacer of the desired thickness as discussed above with respect to FIG. 9. Turning to FIG. 13, a perspective view of a channel spacer 100 is depicted according to various embodiments. In this example the channel spacer 100 is generally disc-shaped with a wall portion 102 that defines a channel 104 leading from an entry point 117 to a central hole 106. According to various implementations, the channel 104 has a serpentine configuration, though other configurations are possible. In some cases the channel spacer 100 is formed from a conductive (e.g., metal) material. In some cases another suitable material may be used. According to various implementations, the channel 104 can be formed in a metal disc or plate through machining, etching, laser etching, or another suitable process. In some cases the thickness of the resulting channel spacer may be from 0.001 inches to 0.015 inches. Other suitable dimensions are also possible.

Figure 14:
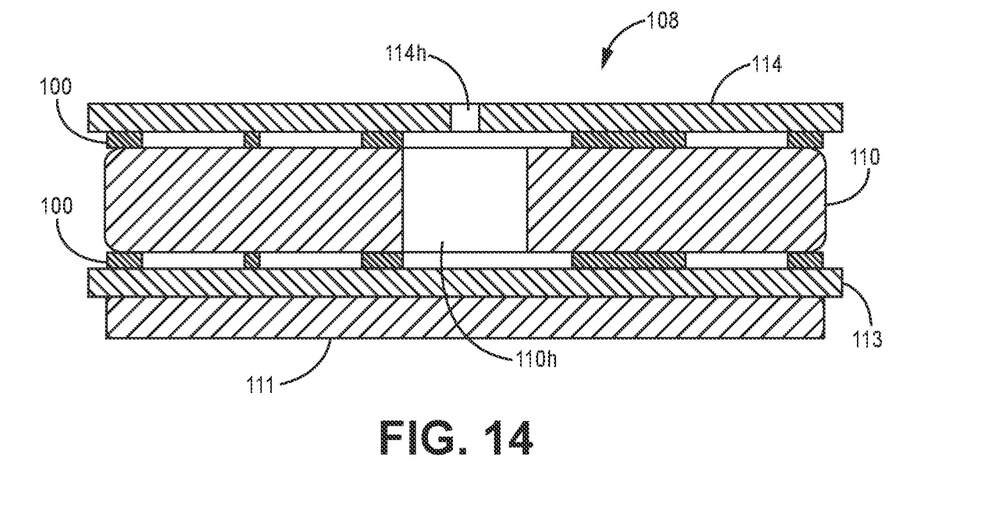
FIG. 14 is a sectional view of a discharge stack according to an embodiment.

FIG. 14 is a side sectional view of a discharge stack 108 according to various implementations of the disclosed technology. As can be seen, the stack 108 includes two instances of the channel spacer 100, positioned adjacent to opposite exterior surfaces of a first conductive spacer 110. One channel spacer 100 is positioned between the first conductive spacer and a first insulation plate 113. The opposing surfaces of the conductive spacer 110 and the insulation plate 113 have smooth surfaces that bound the sides of channel 104 in combination with the spacer wall 102 to form a plasma chamber. Another channel spacer 100 positioned between the first conductive spacer 110 and a second insulation plate 114 forms a second plasma chamber in the same way.

In some cases a feed or supply gas is introduced into each of the channels 104 through openings 117 shown in FIG. 13. During plasma discharge, a product gas forms in the channels 104 and flows out through the central opening, through the opening 110h (in the case of the lower channel spacer) and then through the opening 114h of the upper insulation plate 114. From there the product gas can be directed to a suitable outlet, examples of which are discussed elsewhere herein.

Although the various embodiments have been described with reference to preferred implementations, persons skilled in the art will recognize that changes may be made in form and detail without departing from the spirit and scope thereof.

What is claimed is:

1. A plasma reaction cell, comprising:
a first gas port;
a second gas port;
a discharge chamber comprising a base plate, a side wall attached to the base plate, and a cooling plate attached to the side wall opposite the base plate;
a discharge stack mounted within the discharge chamber, the discharge stack comprising:
a first insulation plate positioned adjacent to the cooling plate;
a first conductive spacer positioned proximate to the first insulation plate;
a second insulation plate positioned proximate to the first conductive spacer, opposite from the first insulation plate;
a second conductive spacer positioned adjacent to the second insulation plate opposite from the first conductive spacer;
a first gas channel formed between the first conductive spacer and the first insulation plate, the first gas channel comprising a first end in fluid communication with the first gas port and a second end in fluid communication with the second gas port; and
a second gas channel formed between the first conductive spacer and the second insulation plate, the second gas channel comprising a first end in fluid communication with the first gas port and a second end in fluid communication with the second gas port; and
an electrode electrically coupled to the first conductive spacer and extending through the side wall of the discharge chamber.

2. The plasma reaction cell of claim 1, wherein:
the cooling plate comprises a first gas passage in fluid communication with the first gas port and a second gas passage in fluid communication with the second gas port;
the first insulation plate comprises a plate opening in fluid communication with the second gas passage; and
the first conductive spacer comprises a spacer opening in fluid communication between the second ends of the first and second gas channels and the plate opening.

3. The plasma reaction cell of claim 2, wherein the second gas passage comprises a passage opening in fluid communication with the plate opening, and wherein the passage opening has a diameter of about 0.375 inches, the plate opening has a diameter of about 0.200 inches, and the spacer opening has a diameter of about 0.875 inches.

4. The plasma reaction cell of claim 1, wherein the discharge stack further comprises:
a first channel spacer positioned between the first insulation plate and the first conductive spacer, the first channel spacer forming the first gas channel; and
a second channel spacer positioned between the second insulation plate and the first conductive spacer, the second channel spacer forming the second gas channel.

5. The plasma reaction cell of claim 4, wherein the first and second channel spacers comprise a conductive material.

6. The plasma reaction cell of claim 4, wherein the first and second channel spacers have a thickness of about 0.001 inches to about 0.015 inches.

7. The plasma reaction cell of claim 1, wherein the first conductive spacer comprises first and second surfaces and wherein:
the first gas channel is formed in the first surface between the first conductive spacer and the first insulation plate; and
the second gas channel is formed in the second surface between the first conductive spacer and the second insulation plate.

8. The plasma reaction cell of claim 1, wherein the cooling plate comprises a heatsink plate.

9. The plasma reaction cell of claim 1, wherein the cooling plate comprises a fluid cooling passage in fluid communication with first and second fluid ports.

10. The plasma reaction cell of claim 1, wherein the side wall is cylindrical.

11. A plasma reaction cell, comprising:
a discharge chamber comprising a base plate, a side wall attached to the base plate, and a heatsink plate attached to the side wall opposite the base plate, the heatsink plate comprising first and second gas passages extending between an interior and an exterior of the discharge chamber;
a discharge stack mounted within the discharge chamber, the discharge stack comprising:
a first insulation plate positioned adjacent to the heatsink plate, the first insulation plate comprising a plate opening in fluid communication with the second gas passage;
a first conductive spacer positioned adjacent to the first insulation plate, the first conductive spacer comprising:
first and second opposing surfaces;
a spacer opening in communication with the plate opening;
a first gas channel formed in the first surface and comprising a first end in fluid communication with the first gas passage and a second end in fluid communication with the spacer opening;
a second gas channel formed in the second surface and comprising a first end in fluid communication with the first gas passage and a second end in fluid communication with the spacer opening;
a second insulation plate positioned adjacent to the first conductive spacer, opposite from the first insulation plate; and
a second conductive spacer positioned adjacent to the second insulation plate opposite from the first conductive spacer; and
an electrode electrically coupled to the first conductive spacer and extending through the side wall of the discharge chamber.

12. A plasma reaction cell, comprising:
a first gas port;
a second gas port;
a first discharge chamber comprising a first support plate, a first side wall attached to the first support plate, and a cooling plate attached to the first side wall opposite the first support plate, the cooling plate comprising a first gas passage in fluid communication with the first gas port and a second gas passage in fluid communication with the second gas port;
a second discharge chamber comprising the cooling plate, a second side wall attached to the cooling plate opposite the first side wall, and a second support plate attached to the second side wall opposite the cooling plate;

a first discharge stack mounted within the first discharge chamber;
a second discharge stack mounted within the second discharge chamber;
a first electrode extending through the first side wall; and
a second electrode extending through the second side wall;
wherein each of the first and second discharge stacks comprises:
   a first insulation plate positioned adjacent to the cooling plate;
   a first conductive spacer positioned proximate the first insulation plate and electrically coupled to one of the first and the second electrodes;
   a second insulation plate positioned proximate the first conductive spacer, opposite from the first insulation plate;
   a second conductive spacer positioned adjacent to the second insulation plate opposite from the first conductive spacer;
   a first gas channel formed between the first conductive spacer and the first insulation plate, the first gas channel comprising a first end in fluid communication with the first gas passage and a second end in fluid communication with the second gas passage; and
   a second gas channel formed between the first conductive spacer and the second insulation plate, the second gas channel comprising a first end in fluid communication with the first gas passage and a second end in fluid communication with the second gas passage.

13. The plasma reaction cell of claim 12, wherein the first conductive spacer comprises a spacer opening in fluid communication between the second ends of the first and second gas channels and the second gas passage.

14. The plasma reaction cell of claim 12, wherein the cooling plate comprises a fluid cooling passage in fluid communication with first and second fluid ports.

15. The plasma reaction cell of claim 12, wherein the first conductive spacer comprises first and second surfaces and wherein:
   the first gas channel is formed in the first surface between the first conductive spacer and the first insulation plate; and
   the second gas channel is formed in the second surface between the first conductive spacer and the second insulation plate.

16. The plasma reaction cell of claim 12, wherein the first conductive spacer comprises opposing first and second surfaces and wherein the first gas channel is formed in a surface of the first insulation plate facing the first surface of the conductive spacer and the second gas channel is formed in a surface of the second insulation plate facing the second surface of the first conductive spacer.

17. The plasma reaction cell of claim 12, wherein each of the first and second discharge stacks further comprises:
   a first channel spacer positioned between the first insulation plate and the first conductive spacer, the first channel spacer forming the first gas channel; and
   a second channel spacer positioned between the second insulation plate and the first conductive spacer, the second channel spacer forming the second gas channel.

18. The plasma reaction cell of claim 17, wherein the first and second channel spacers comprise a conductive material.

19. The plasma reaction cell of claim 17, wherein the first and second channel spacers have a thickness of about 0.001 inches to about 0.015 inches.

20. The plasma reaction cell of claim 12, wherein the side wall is cylindrical.

* * * * *